(12) United States Patent
Yu et al.

(10) Patent No.: US 9,386,701 B2
(45) Date of Patent: Jul. 5, 2016

(54) ELECTRONIC COMPONENT EMBEDDED PRINTED CIRCUIT BOARD

(71) Applicant: Samsung Electro-Mechanics Co., Ltd., Suwon (KR)

(72) Inventors: Yeon Seop Yu, Sungnam (KR); Moon Il Kim, Daejeon (KR); Jun Young Kim, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 65 days.

(21) Appl. No.: 14/092,188

(22) Filed: Nov. 27, 2013

(65) Prior Publication Data

US 2014/0151100 A1   Jun. 5, 2014

(30) Foreign Application Priority Data

Nov. 30, 2012  (KR) .................. 10-2012-0138044
Nov. 21, 2013  (KR) .................. 10-2013-0142245

(51) Int. Cl.
*H05K 1/00* (2006.01)
*H05K 1/18* (2006.01)
*H05K 1/03* (2006.01)

(52) U.S. Cl.
CPC .............. *H05K 1/185* (2013.01); *H05K 1/0373* (2013.01); *H05K 2201/0239* (2013.01); *H05K 2201/10636* (2013.01)

(58) Field of Classification Search
CPC ............. H05K 1/00; H05K 1/11; H05K 1/18; H05K 3/30; H01L 21/02; H01L 21/48; H01L 23/12; H01L 23/14; H01L 23/48; H01L 23/52

USPC .......... 174/258, 255, 260–262, 268; 361/523, 361/762–764; 257/678, 687; 156/247, 156/272.6

See application file for complete search history.

(56) References Cited

U.S. PATENT DOCUMENTS

| 5,466,893 | A | * | 11/1995 | Nakatani et al. | 174/261 |
| 6,724,638 | B1 | * | 4/2004 | Inagaki et al. | 361/763 |
| 6,809,268 | B2 | * | 10/2004 | Hayashi et al. | 174/260 |
| 7,371,606 | B2 | * | 5/2008 | Ujiie et al. | 438/106 |
| 8,544,169 | B2 | * | 10/2013 | Takano | 29/852 |
| 2002/0011351 | A1 | * | 1/2002 | Ogawa et al. | 174/260 |
| 2002/0117743 | A1 | * | 8/2002 | Nakatani et al. | 257/687 |

(Continued)

FOREIGN PATENT DOCUMENTS

| JP | 10-509277 | 9/1998 |
| JP | 3251949 | 1/2002 |

(Continued)

OTHER PUBLICATIONS

Korean Office Action dated Nov. 24, 2014 in corresponding Korean Patent Application No. 10-2013-0142245.

(Continued)

*Primary Examiner* — Xiaoliang Chen
(74) *Attorney, Agent, or Firm* — NSIP Law

(57) ABSTRACT

An electronic component embedded printed circuit board includes a core having a cavity; an electronic component inserted in the cavity; insulating layers laminated on top and bottom of the core and mixed with a coupling agent, which has functional groups respectively acting on an organic material and an inorganic material, to be bonded to an outer peripheral surface of the electronic component; and circuit patterns provided on the insulating layers.

15 Claims, 3 Drawing Sheets

(56) References Cited

U.S. PATENT DOCUMENTS

| | | | |
|---|---|---|---|
| 2004/0125543 A1* | 7/2004 | Hirano et al. | 361/523 |
| 2005/0073818 A1* | 4/2005 | Hirano et al. | 361/763 |
| 2005/0133895 A1* | 6/2005 | Ujiie et al. | 257/678 |
| 2006/0012967 A1* | 1/2006 | Asai et al. | 361/764 |
| 2009/0242252 A1* | 10/2009 | Tanaka | 174/260 |
| 2010/0163168 A1* | 7/2010 | Saita et al. | 156/247 |
| 2010/0163172 A1* | 7/2010 | Saita et al. | 156/272.6 |
| 2011/0056740 A1* | 3/2011 | Takano | 174/262 |
| 2011/0147072 A1* | 6/2011 | Yamashita et al. | 174/268 |
| 2011/0290540 A1* | 12/2011 | Jung et al. | 174/255 |
| 2013/0081870 A1* | 4/2013 | Furutani et al. | 174/262 |
| 2014/0153204 A1* | 6/2014 | Kim et al. | 361/762 |

FOREIGN PATENT DOCUMENTS

| | | |
|---|---|---|
| JP | 3335707 | 10/2002 |
| JP | 2013-84692 | 5/2013 |
| KR | 10-2012-0071938 | 7/2012 |

OTHER PUBLICATIONS

Korean Notice of Allowance dated Mar. 27, 2015 in corresponding Korean Patent Application No. 10-2013-0142245.

\* cited by examiner

NORMAL    DEFECTIVE

ELECTRONIC COMPONENT EMBEDDED PRINTED CIRCUIT BOARD

CROSS-REFERENCE TO RELATED APPLICATIONS

This application claims the foreign priority benefit under 35 U.S.C. Section 119 of Korean Application Nos. 10-2012-0138044 and 10-2013-0142245, filed Nov. 30, 2012 and Nov. 20, 2013, which are hereby incorporated by reference in their entirety into this application.

BACKGROUND OF THE INVENTION

1. Field of the Invention

The present invention relates to an electronic component embedded printed circuit board and a method for manufacturing the same.

2. Description of the Related Art

As the size of substrates is limited and multiple functions of electronic devices are required with the miniaturization and thinning of the IT electronic devices including mobile phones, it is required to mount electronic components for implementing more functions in the limited area of the substrate.

However, as the size of the substrate is limited, since it is not possible to secure a sufficient mounting area of the electronic components, there is a demand for a technology of inserting electronic components like active devices, such as ICs and semiconductor chips, and passive devices in a substrate. In recent times, a technology of embedding active devices and passive devices in the same layer or a technology of embedding active devices and passive devices in a substrate by stacking them has been developed.

Typically, a method for manufacturing an electronic component embedded printed circuit board forms a cavity in a core of a substrate and inserts electronic components such as various devices, ICs, and semiconductor chips in the cavity. After that, a resin material such as prepreg is applied inside the cavity and on the core in which the electronic component is inserted to form an insulating layer as well as to fix the electronic component, and a via hole or a through hole is formed in the insulating layer and a circuit is formed by plating to allow the electronic component to conduct with the outside of the substrate.

At this time, a circuit pattern is formed inside and on the via hole or the through hole by plating to be used as an electrical connection means with the electronic component embedded in the substrate, and a multilayer printed circuit board in which the electronic component is embedded can be manufactured by sequentially laminating the insulating layer on upper and lower surfaces of the substrate.

In the conventional electronic component embedded printed circuit board like this, since soldering and reflow processes are repeated in every manufacturing process, a high temperature heat is applied to the laminate, and warpage of the substrate may occur whenever heating the laminate at high temperature. At this time, as the electronic component embedded in the substrate is made of a material having a different coefficient of thermal expansion (CTE) from the insulating layer bonded to the outside thereof, stress is concentrated on the bonding interface with the insulating layer due to repetition of the warpage of the substrate in every heating process, and as the process proceeds, delamination or lifting of the bonding interface occurs due to thermal shock.

RELATED ART DOCUMENT

Patent Document

Patent Document 1: Korean Patent Laid-open Publication No. 2012-0071938

SUMMARY OF THE INVENTION

The present invention has been invented in order to overcome the above-described problems and it is, therefore, an object of the present invention to provide an electronic component embedded printed circuit board that can improve mechanical characteristics and reliability between an electronic component embedded in a printed circuit board and an insulating layer covered on the electronic component.

In accordance with one aspect of the present invention to achieve the object, there is provided an electronic component embedded printed circuit board including: a core having a cavity; an electronic component inserted in the cavity; insulating layers laminated on top and bottom of the core and mixed with a coupling agent, which has functional groups respectively acting on an organic material and an inorganic material, to be bonded to an outer peripheral surface of the electronic component; and circuit patterns provided on the insulating layers.

The electronic component may be an MLCC including external electrodes provided on both sides and a main body provided between the external electrodes.

The coupling agent mixed in the insulating layer may consist of at least two functional groups and represented by the following Chemical Formula.

$$(XO)_n\text{—Ti—}(OY)_{4-n} \qquad \text{Chemical Formula}$$

Here, X is an alkyl group, Y is an organo-functional group, and n is a natural number including 1, 2, 3.

The organotitanates may be one of monoalkoxy, chelate, coordinate, quat salt, neoalkoxy, and cyclo heteroatom.

The insulating layer may be made of a thermosetting resin composition containing an inorganic filler and may be made of a prepreg (PPG) containing 0.1 to 3.0 wt % of organotitanates based on the weight of the inorganic filler mixed in the thermosetting resin composition.

A via may be further included inside the insulating layer to electrically connect the circuit pattern and the external electrode, and circuit layers of a predetermined pattern may be formed on upper and lower surfaces of the core to be electrically connected through a through hole.

The insulating layer may be filled in a space between the cavity and the electronic component to surround the entire outer peripheral surface of the electronic component.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

A matter regarding to an operational effect including a technical configuration for an object of an electronic component embedded printed circuit board and a method of manufacturing the same in accordance with the present invention will be clearly appreciated through the following detailed description with reference to the accompanying drawings showing preferable embodiments of the present invention.

Electronic Component Embedded Printed Circuit Board

Figure 1:
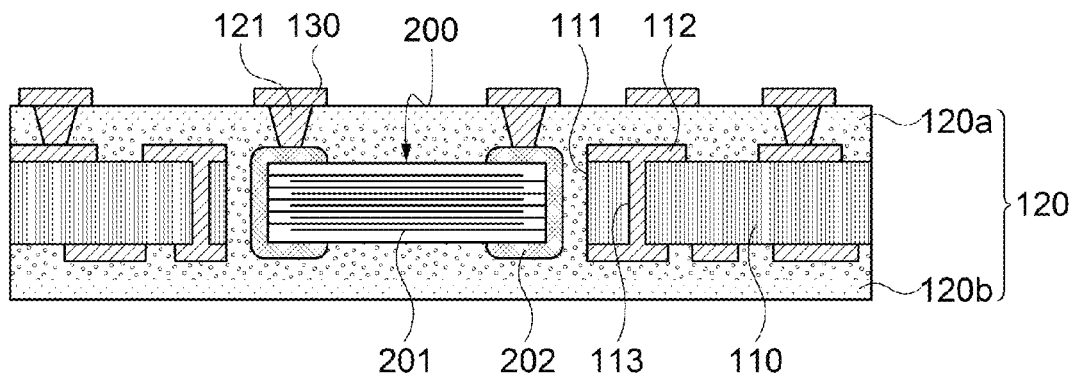
FIG. 1 is a cross-sectional view of an electronic component embedded printed circuit board in accordance with an embodiment of the present invention.

First, FIG. 1 is a cross-sectional view of an electronic component embedded printed circuit board in accordance with the present invention.

As shown, in an electronic component embedded printed circuit board 100 in accordance with the present invention, an electronic component 200 may be embedded in a core 110 having a cavity 111, and insulating layers 120 may be laminated on top and bottom of the core 110. The insulating layer 120 may be made of a thermosetting resin composition containing organotitanates.

In the electronic component embedded printed circuit board 100, although it is shown that the electronic component 200 embedded in the core 110 is embedded in one place, it is not limited thereto. The electronic component 200 may be embedded in a printed circuit board of each unit at regular intervals, and one or more electronic components 200 may be embedded according to the type of the embedded electronic component.

The cavity 111 may be formed in the core 110, which is positioned in the center of the electronic component embedded printed circuit board 100, in the shape of a through hole, and the cavity 111 may be formed by laser processing or drilling using CNC. At this time, it is preferred that the cavity 111 is formed to have a width equal to or greater than that of the electronic component 200 inserted therein.

Further, circuit layers 112 may be formed on upper and lower surfaces of the core 110 in a predetermined pattern, respectively, and the respective circuit layers 112 may be electrically connected through a via or a through hole 113 passing through the core 110.

Meanwhile, the electronic component 200 is inserted in the cavity 111 of the core 110. The electronic component 200 may be an active device such as IC, semiconductor chip, or CPU in addition to a passive device such as MLCC or LTCC. At this time, it is preferred that a height of the electronic component is equal to that of the core.

Here, when describing the electronic component 200 by taking the case of an MLCC shown in the drawing, an internal electrode may be formed in a main body 201, positive and negative external electrodes 202 may be formed on both sides of the main body 201, and the external electrodes 202 on the both sides may be physically and electrically connected to external circuits, respectively.

The insulating layers 120 may be laminated on the top and bottom of the core 110 having the electronic component embedded 220 therein, respectively. The insulating layers 120 may be formed by laminating an insulating material, that is, an insulating resin material such as a prepreg (PPG) and curing the insulating material. At this time, the insulating layers 120 may be pressed on top and bottom of the electronic component 200 to be in direct contact with an outer peripheral surface of the electronic component 200, and the insulating layers 120 may be mutually coupled by being bonded to the outer peripheral surface of the electronic component 200.

Further, the insulating layer 120 may be made of a thermosetting resin composition containing an inorganic filler such as silica. At this time, organotitanates may be added to the insulating layer. The organotitanates may be mixed in an amount of 0.1 to 3.0 wt % based on the weight of the inorganic filler included in the insulating layer 120. The organotitanates may be evenly mixed together with the inorganic filler through stirring when manufacturing a prepreg before applying the insulating layer 120.

The organotitanates, which is a coupling agent for improving adhesion between an inorganic material and an organic material, is a material used to improve adhesion between various types of powder and the resin constituting the insulating layer.

Further, the organotitanates improves the adhesion between the inorganic material and the organic material by the following Chemical Formula through two functional groups, that is, a functional group —OY, which is combined with the organic material, and a functional group XO—, which is combined with the inorganic material.

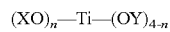
$$(XO)_n\text{—Ti—}(OY)_{4-n}$$ Chemical Formula

Here, X is an alkyl group, Y is an organo-functional group, and n is a natural number including 1, 2, 3.

Meanwhile, typically, the alkyl group may be n-propyl, iso-propyl, n-butyl, iso-octylethyl, etc. and the organo-functional group may be carboxyl, ester, phosphato, pyrophosphato, sulfonato, etc. In addition, various types of functional groups for combination with polar or non-polar thermoplastic polymers and thermosetting polymers may be used.

Like this, it is possible to prevent separation of the insulating layer from the surface of the electronic component 200 in spite of repeated warpage of the insulating layer and thermal shocks applied to the insulating layer during a manufacturing process of the printed circuit board by reinforcing the mutual adhesion on the bonding interface of the electronic component 200 and the insulating layer 120 through the coupling by the functional groups of the organotitanates mixed in the insulating layer 120.

At this time, typically, the organotitanates, which is a coupling agent mixed in the insulating layer 120, may be monoalkoxy, chelate, coordinate, quat salt, neoalkoxy, cyclo heteroatom, etc.

When the organotitanates is mixed in the insulating layer 120 in an amount of less than 0.1 wt % based on the weight of the inorganic filler in the insulating layer, it is not possible to obtain a sufficient adhesive strength on the bonding interface of the electronic component 200 and the insulating layer 120, and when exceeding 3.0 wt %, the effect of increasing the adhesion on the bonding interface of the electronic component 200 and the insulating layer 120 may be reduced. At this time, when the organotitanates is included in an amount of greater than 3.0 wt %, the adhesion with the electronic component 200 may be reduced due to aggregation of the organotitanates in the insulating layer and it may be difficult to remove alcohol by-products generated through a reaction with ceramic components constituting an MLCC which is the electronic component 200 applied to the present embodiment.

The insulating layers 120 may be formed to be laminated on the top and bottom of the core 110 including the electronic component 200 and partially introduced into the interface between the electronic component 200 and the core 110 when pressed to surround the entire outer peripheral surface of the electronic component 200.

A plurality of vias 121 may be formed in the insulating layer 120. The via 121 may be formed by laser processing or drilling using CNC similarly to the cavity 111 formed in the core 110. A circuit pattern 130, which is electrically connected to the electronic component 200, may be formed by forming a plating layer on the upper surface of the insulating layer 120 including the via after forming the via 121 and etching the plating layer.

The electronic component embedded printed circuit board 100 configured like this can improve bonding performance by the coupling action of the organotitanates mixed in the insulating layer 120 on the bonding interface between the surface of the electronic component 200 embedded in the core 110 and the insulating layers 120 laminated on the top and bottom of the core 110.

Embodiment of Method for Manufacturing Electronic Component Embedded Printed Circuit Board A method for manufacturing the electronic component embedded printed circuit board of the present invention configured as above will be described with reference to the following drawings.

First, FIGS. 2A to 2E are process diagrams showing a process of manufacturing an electronic component embedded printed circuit board in accordance with an embodiment of the present invention.

Figure 2A:
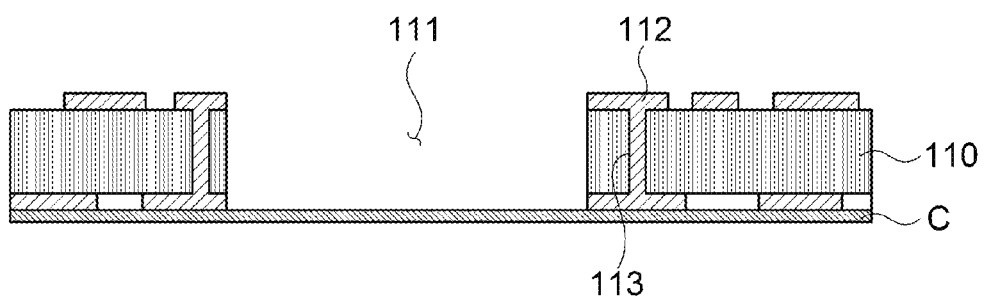
FIGS. 2A to 2E are process diagrams of a processes of manufacturing an electronic component embedded printed circuit board in accordance with an embodiment of the present invention.

First, as shown in FIG. 2A, a cavity 111 is formed in a core 110, which is made of an insulating material, in the shape of a through hole. The cavity 111 may be formed by laser processing or drilling. The cavity 111 is formed with a predetermined size and may be formed with a width equal to or greater than a width of an electronic component 200 inserted therein.

Additionally, a carrier C may be attached to a lower surface of the core 110. The carrier C, which is a member for fixing a position of the electronic component 200 when inserting the electronic component 200 in the cavity 111 formed as a through hole, prevents the electronic component 200 from being separated from the cavity 111 and temporarily fixes the electronic component 200 by an adhesive member applied on an upper surface thereof.

Figure 2B:
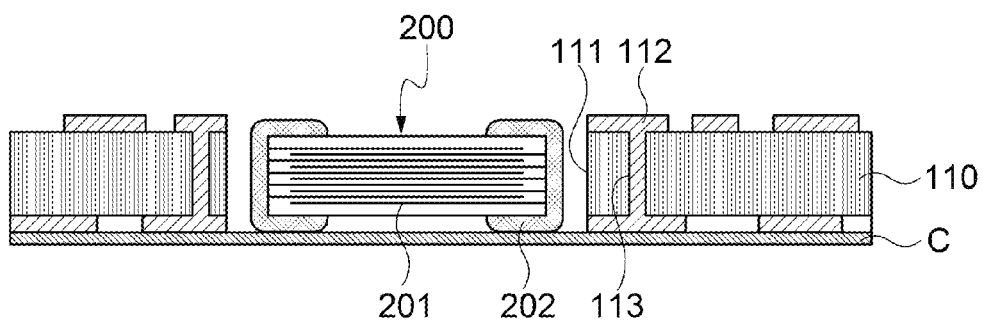

Next, as shown in FIG. 2B, the electronic component 200 is inserted in the cavity 111 of the core 110 to be positioned on the carrier C. It is preferred that the electronic component 200 is an electronic component having the same height as the thickness of the core 110. When the height of the electronic component 200 is higher than the thickness of the core 110, it is needed to increase the thickness of the core 110 to make the same height.

Figure 2C:
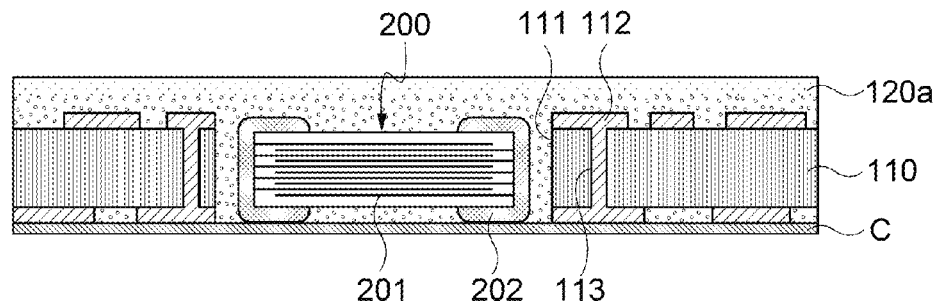
Figure 2D:
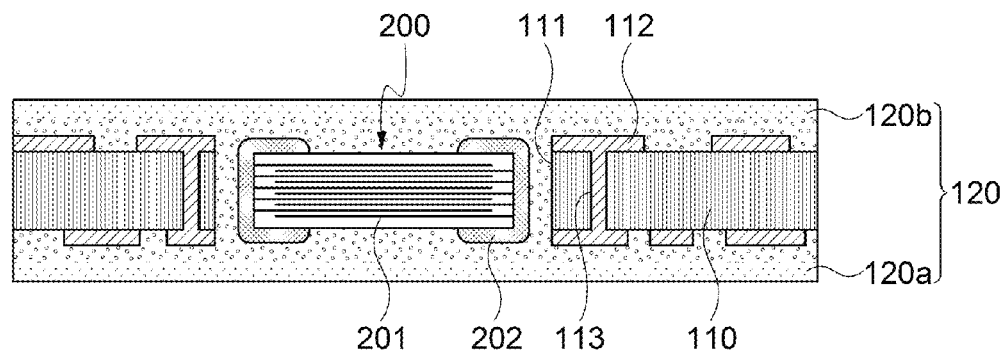

After inserting the electronic component 200 in the cavity 111 of the core 110, as shown in FIGS. 2C and 2D, an upper insulating layer 120a and a lower insulating layer 120b may be laminated on top and bottom of the core 110, respectively. First, the upper insulating layer 120a may be laminated on the top of the core 110. The upper insulating layer 120a may be formed by laminating an insulating material and cured by heating and pressing the insulating material. At this time, the insulating material may be partially introduced into a space between the cavity 111 of the core 110 and the electronic component 200 when heated and pressed and cured to fix the electronic component 200. Apart from this, before forming the upper insulating layer 120a, a separate adhesive may be injected between the electronic component 200 and a sidewall of the cavity 111 to fix the electronic component 200.

And, when the lamination of the upper insulating layer 120a is completed, the carrier C attached to the lower surface of the core 110 is removed. After that, as in FIG. 2D, the core 110 is reversed, and the lower insulating layer 120b is laminated on an opposite surface of the core 110 on which the upper insulating layer 120a is formed in the same manner as the upper insulating layer 120a and cured by heating and pressing to complete the formation of the insulating layers 120a and 120b as in FIG. 2D.

Meanwhile, before laminating the upper and lower insulating layers 120a and 120b, the upper and lower insulating layers 120a and 120b may be made of a prepreg (PPG) material containing a predetermined amount of inorganic filler such as silica and organotitanates.

For this, before laminating the upper and lower insulating layers 120a and 120b on the core 110, the prepreg may be prepared by mixing the inorganic filler and 0.1 to 3.0 wt % of the organotitanates based on the weight of the inorganic filler with a thermosetting resin composition and stirring the mixture. Here, the prepreg containing the organotitanates may act as a coupling agent that improves adhesion between an organic material and an inorganic material by the respective actions of functional groups —OY and —XO on ceramic materials of the insulating layer, which is the organic material, and the electronic component, which is the inorganic material.

Figure 2E:
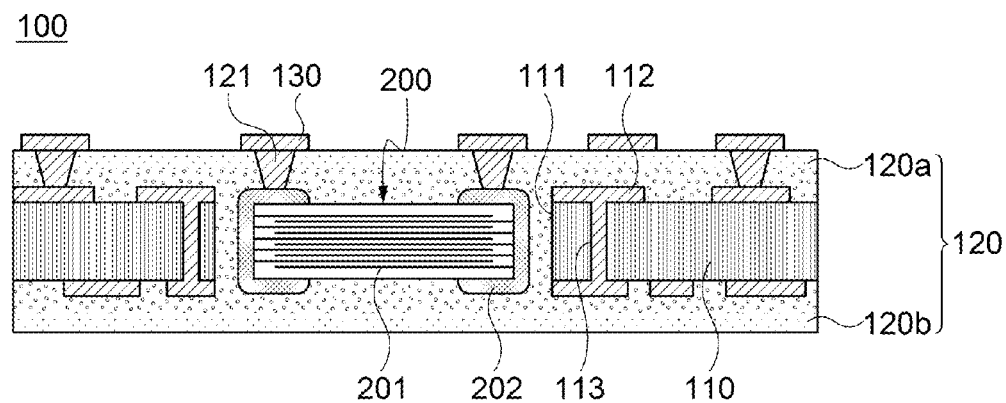

Finally, as in FIG. 2E, a via hole 121 is formed in the upper and lower insulating layers 120a and 120b, a plating layer is formed inside the via hole 121 and on the insulating layers 120a and 120b, and a circuit pattern 130 is formed by etching the plating layer to complete the manufacture of the electronic component embedded printed circuit board.

Evaluation of Bonding Strength of Electronic Component of Electronic Component Embedded Printed Circuit Board Bonding reliability of the electronic component of the electronic component embedded printed circuit board manufactured as in FIG. 1 through the above manufacturing process is tested by the standard specifications. Looking into the results of the test, it can be understood that the adhesion between the insulating layer and the electronic component is reinforced when manufacturing the printed circuit board by including the organotitanates in the insulating layer than when manufacturing the printed circuit board by not including the organotitanates in the insulating layer.

Evaluation of Adhesion Between Electronic Component and Insulating Layer

First, after prepreg (PPG), which is used as a representative material of the insulating layer 120 adhered to the electronic component 200 embedded in the electronic component embedded printed circuit board in accordance with the present invention, and an MLCC (electronic component) are bonded and the prepreg is cured to closely couple the insulating layer and the MLCC, the evaluation was performed by applying a shear stress according to the standard specifications of JESD22-B117.

At this time, the prepreg (PPG) constituting the insulating layer 120 may have a composition in which an inorganic filler is mixed in a thermosetting resin such as resin or epoxy and organotitanates is uniformly mixed in an amount of 0.1 to 3.0 wt % based on the weight of the mixed inorganic filler.

Figure 3:
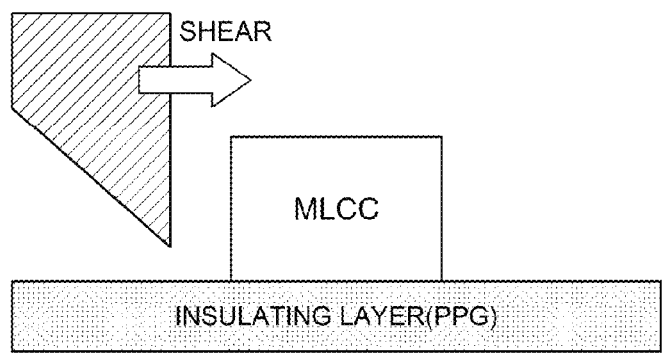
FIG. 3 is a schematic diagram of a device for evaluating adhesion between an electronic component and an insulating layer (prepreg) applied to the electronic component embedded printed circuit board in accordance with the present invention.

By an evaluation device as in FIG. 3 according to the above specifications, it was evaluated that a shear strength (a force when a bonded portion is separated by applying a shear stress to one side) in a state in which the MLCC is bonded on the prepreg that does not contain the organotitanates is averagely 1293 kgf, and a shear strength in a state in which the MLCC is bonded on the prepreg containing the organotitanates is improved by about 44% as average 1860 kgf.

At this time, FIG. 3 is a schematic diagram showing the evaluation device for evaluating the shear stress according to the standard specifications of JESD22-B117.

Figure 4:
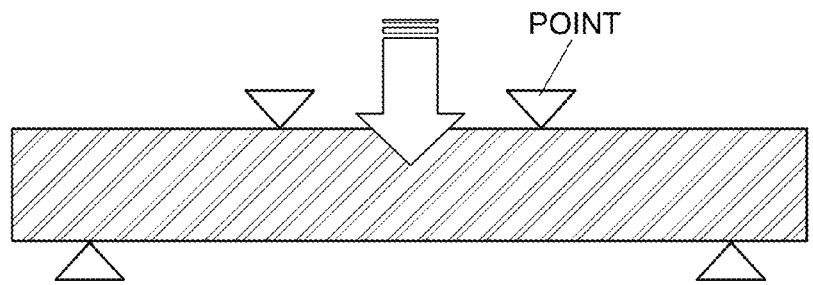
FIG. 4 is a schematic diagram of a bending test of the electronic component embedded printed circuit board in accordance with the present invention.

Evaluation of Bonding Reliability of Electronic Component Embedded in Printed Circuit Board In the electronic component embedded printed circuit board manufactured through the manufacturing method of the present invention, the evaluation of bonding reliability of the electronic component embedded in the substrate and the insulating layer was performed by a bending test according to the standard specifications of JESD22-B113 as shown in FIG. 4 when the manufacture of the printed circuit board is completed. The bending test of the printed circuit board was performed by applying pressure to four points through a commercial bending evaluation tester, pressing to a depth of 2 mm to generate warpage, and repeating bending 20000 times once per second at a frequency of 1 Hz, and the results were evaluated.

Figure 5:
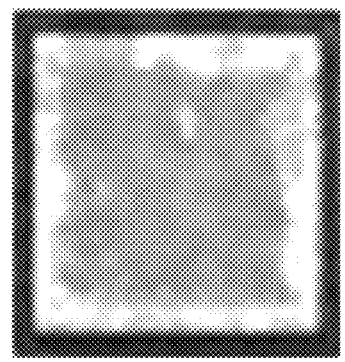
FIG. 5 is a comparison photograph of a normal product of which an electronic component and an insulating layer are not delaminated and a defective product of which an electronic component and an insulating layer are delaminated.
Figure 5:
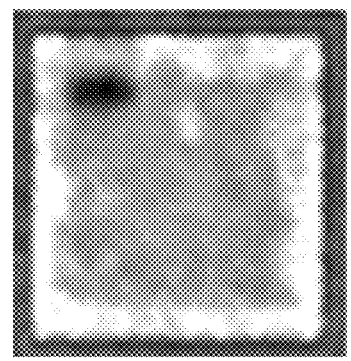

As the result of the evaluation by the above specifications, delamination of the electronic component 200 and the insulating layer 120 was checked through an ultrasonic microscope in the printed circuit board consisting of the insulating layer 120 containing the organotitanates and the printed circuit board consisting of the insulating layer that does not contain the organotitanates. FIG. 5 shows comparison photographs of a normal product in which the electronic component and the insulating layer are not delaminated and a defective product in which the electronic component and the insulating layer are delaminated after the bending test of the electronic component embedded printed circuit board. When the electronic component is delaminated from the insulating layer, a delamination position of the electronic component is identified as black like the photograph on the right. Thus, actual occurrence of the delamination between the electronic component and the insulating layer was checked through a cross-sectional analysis of the printed circuit board.

Further, as shown in Table 1, when looking into the results of the bending test of the printed circuit board in which the organotitanates is applied to the insulating layer and the printed circuit board in which the organotitanates is not included in the insulating layer, it was checked that the bonding reliability is greatly improved in the embodiment in which the printed circuit board is manufactured by including the organotitanates in the insulating layer than the case in which the printed circuit board is manufactured by not including the organotitanates in the insulating layer. It could be checked that the bonding reliability is improved when the organotitanates is included in the insulating layer in an amount of 0.1 to 3.0 wt % based on the weight of the previously mixed inorganic filler.

TABLE 1

| Organotitanates content in insulating layer, wt % (based on inorganic filler) | Number of bending tests | Number of internal delamination defects |
|---|---|---|
| 0 | 20000 | 17/200 |
| 0.05 | 20000 | 17/200 |
| 0.1 | 20000 | 10/200 |
| 1 | 20000 | 0/200 |
| 2 | 20000 | 0/200 |
| 3 | 20000 | 5/200 |
| 5.0 | 20000 | 12/200 |

As described above, the electronic component embedded printed circuit board in accordance with the present invention can improve bonding and adhesion performances of the insulating layers laminated on the top and bottom of the core and the surface of the electronic component by mixing the organotitanates coupling agent in the insulating layer, which surrounds the electronic component embedded in the core, and can prevent substrate defects and improve the yield of the printed circuit board products by improving coupling performance of the insulating layer and the electronic component to prevent delamination and lifting of the insulating layer from the electronic component.

The above-described preferred embodiments of the present invention are disclosed for the purpose of exemplification and it will be appreciated by those skilled in the art that various substitutions, modifications and variations may be made in these embodiments without departing from the technical spirit of the present invention. Such substitutions and modifications are intended to be included in the appended claims.

What is claimed is:

1. An electronic component embedded printed circuit board comprising:
   a core having a cavity;
   an electronic component inserted in the cavity; and
   insulating layers laminated on top and bottom of the core and mixed with a coupling agent, which has functional groups respectively coupled to an organic material and an inorganic material, to be bonded to an outer peripheral surface of the electronic component; and circuit patterns provided on the insulating layers,
   the coupling agent mixed in the insulating layer being organotitanates that consist of at least two functional groups and are represented by $(XO)_n$—Ti—$(OY)_{4-n}$ where X is an alkyl group, Y is an organo-functional group, and n is a natural number including 1, 2, 3.

2. The electronic component embedded printed circuit board according to claim 1,
   wherein the electronic component is a multilayer ceramic capacitor (MLCC) comprising external electrodes provided on both sides and a main body provided between the external electrodes.

3. The electronic component embedded printed circuit board according to claim 1,
   wherein the organotitanates is mixed in an amount of 0.1 to 3.0 wt % based on the weight of an inorganic filler included in the insulating layer.

4. The electronic component embedded printed circuit board according to claim 1,
   wherein the alkyl group is one of n-propyl, iso-propyl, n-butyl, and iso-octylethyl.

5. The electronic component embedded printed circuit board according to claim 1,
   wherein the organo-functional group is one of carboxyl, ester, phosphato, pyrophosphato, and sulfonato.

6. The electronic component embedded printed circuit board according to claim 1,
   wherein the organotitanates is one of monoalkoxy, chelate, coordinate, quat salt, neoalkoxy, and cyclo heteroatom.

7. The electronic component embedded printed circuit board according to claim 1, further comprising:
a via formed inside the insulating layer to electrically connect the circuit pattern and the external electrode.

8. The electronic component embedded printed circuit board according to claim 1,
wherein the insulating layer is filled in a space between the cavity and the electronic component to surround the entire outer peripheral surface of the electronic component.

9. The electronic component embedded printed circuit board according to claim 2,
wherein circuit layers of a predetermined pattern are formed on upper and lower surfaces of the core to be electrically connected through a through hole.

10. An electronic component embedded printed circuit board comprising:
a core having a cavity;
an electronic component inserted in the cavity; and
insulating layers laminated on top and bottom of the core and mixed with a coupling agent, which has functional groups respectively coupled to an organic material and an inorganic material, to be bonded to an outer peripheral surface of the electronic component; and circuit patterns provided on the insulating layers,
the insulating layers being made of a thermosetting resin composition containing an inorganic filler and being made of a prepreg (PPG) containing 0.1 to 3.0 wt % of organotitanates based on the weight of the inorganic filler mixed in the thermosetting resin composition.

11. The electronic component embedded printed circuit board according to claim 10,
wherein the electronic component is a multilayer ceramic capacitor (MLCC) comprising external electrodes provided on both sides and a main body provided between the external electrodes.

12. The electronic component embedded printed circuit board according to claim 10, wherein the organotitanates is one of monoalkoxy, chelate, coordinate, quat salt, neoalkoxy, and cyclo heteroatom.

13. The electronic component embedded printed circuit board according to claim 10, further comprising:
a via formed inside the insulating layer to electrically connect the circuit pattern and the external electrode.

14. The electronic component embedded printed circuit board according to claim 10,
wherein the insulating layer is filled in a space between the cavity and the electronic component to surround the entire outer peripheral surface of the electronic component.

15. The electronic component embedded printed circuit board according to claim 11,
wherein circuit layers of a predetermined pattern are formed on upper and lower surfaces of the core to be electrically connected through a through hole.

* * * * *